United States Patent [19]
Chaumonot et al.

[11] Patent Number: 5,141,798
[45] Date of Patent: Aug. 25, 1992

[54] ENAMEL FOR GLASS PANES PROVIDED WITH SILVER CONDUCTING TRACKS

[75] Inventors: Josselin Chaumonot, Limoges; Guy Roche, Isle, both of France

[73] Assignee: Degussa Aktiengesellschaft, Frankfurt am Main, Fed. Rep. of Germany

[21] Appl. No.: 812,833

[22] Filed: Dec. 20, 1991

Related U.S. Application Data

[63] Continuation of Ser. No. 462,534, Jan. 3, 1990, abandoned.

[30] Foreign Application Priority Data

Jan. 4, 1989 [EP] European Pat. Off. ........ 89100078.8

[51] Int. Cl.$^5$ ................................................. B32B 3/00
[52] U.S. Cl. ..................................... 428/195; 428/209; 428/210; 428/428; 428/432; 428/433; 501/17; 501/19; 501/22; 296/841
[58] Field of Search ............... 501/17, 19, 22; 106/1.14; 296/84.1; 428/192, 195, 209, 210, 428, 433, 432

[56] References Cited

U.S. PATENT DOCUMENTS

| | | | |
|---|---|---|---|
| 4,415,196 | 11/1983 | Baum et al. | 296/84.1 |
| 4,830,894 | 5/1989 | Roche et al. | 428/35.4 |
| 4,837,383 | 6/1989 | Andrews | 427/108 |
| 4,959,090 | 9/1990 | Reinherz | 65/60 |
| 4,959,256 | 9/1990 | Piers | 428/144 |

FOREIGN PATENT DOCUMENTS 0294503 12/1988 Fed. Rep. of Germany .

OTHER PUBLICATIONS

Sivchikova, M. et al., "Ceramic Glazes for Glazed Surfaces", *Chemical Abstracts* (1974), 81:67798g.
Ishizu, T., and M. Motomura, "Color Coating Material for Glass", *Chemical Abstracts* (1987), 107:11812v.

*Primary Examiner*—Patrick J. Ryan
*Assistant Examiner*—Elizabeth Evans
*Attorney, Agent, or Firm*—Beveridge, DeGrandi & Weilacher

[57] ABSTRACT

Enamel-like coatings consisting of glass frits and pigments are used for auto glass panes. An improved opacity of these enamel layers relative to silver conducting tracks on these layers is achieved if 0.1 to 10% by weight silicon, boron, carbon, lead and/or silver in elemental form are added to the enamel.

10 Claims, No Drawings

ENAMEL FOR GLASS PANES PROVIDED WITH SILVER CONDUCTING TRACKS

This application is a continuation of application Ser. No. 07/462,534, filed Jan. 3, 1990, now abandoned.

The invention concerns an enamel for glass panes subsequently provided with silver conducting tracks or leads. The enamel which exhibits an improved opacity for silver layers comprises a glass frit and one or more pigments in the form of heavy-metal oxides or sulfides plus one or more additives in elemental form.

BACKGROUND OF THE INVENTION

Enamel-like coatings or decorative layers are being applied to auto glass panes to an increasing extent, e.g. in the form of frame-like, opaque coatings along the edge of auto panes which are inserted into the auto body in accordance with the method of direct adhesion. These enamel coatings prevent visibility through the glass pane onto the adhesive connection and serve to increase the adhesion of the adhesive and to protect the adhesive from damaging UV rays. Opaque colored enamel coatings are also applied onto glass panes for other purposes as a cohesive layer or in interrupted form in order to achieve decorative effects. The enamel-like coatings customary for this application consist of a molten glass phase in which coloring pigments are embedded.

It is known that conductor circuits or radio antennas can be produced on vehicle panes with the aid of silver pastes which are applied e.g. by means of screen process printing and are stoved during thermal treatment of the glass. Wherever silver is to be applied in enamelled zones, it is generally applied onto the enamel or between two layers of enamel in order to remove it from the view of the observer, who looks through the pane from the outside, that is, from the non-enameled side.

The enamels used for vehicle panes generally consist of a glass frit or of a mixture of meltable frits as well as of coloring pigments which impart the desired coloration and the covering capacity to them.

The glass frits conventionally used as base for the enamels generally exhibit the following composition (% by weight):

| | |
|---|---|
| PbO | 48–60 |
| $SiO_2$ | 28–35 |
| $B_2O_3$ | 2–6 |
| $Na_2O$ | 1–5 |
| $TiO_2$ | 1–4 |
| $ZrO_2$ | 1–3 |
| $Al_2O_3$ | 0–3 |
| CdO | 0–3 |
| CaO | 0–2 |
| ZnO | 0–1 |
| $K_2O$ | 0–1. |

The oxides of chromium and copper or the oxides of chromium, iron, nickel and/or manganese are used as pigments for black color tones. For grey color tones, in addition to the black pigments cited, other pigments are also used such as tin oxide or titanium oxide; for blue color tones, oxides of cobalt, aluminum, silicon and zinc, and for yellow, lead sulfides, antimony sulfides or cadmium sulfides.

It is known that silver compounds which are applied onto glass or enamel impart a yellowish to brown coloration to it due to transparency effects which coloration is conditioned by the diffusion of the silver ions into the glass.

If, therefore, silver pastes are applied onto the enamels for glass, then the glass exhibits a coloration extending from yellow to brown when looked through, which coloration is only insufficiently covered by the enamel layer.

In order to avoid this phenomenon, which adversely affects the appearance of the enamelled glass, the attempt was made to mask the silver layer to the extent possible by treating the enamel and the silver; however, the results were generally unsatisfactory.

SUMMARY OF THE INVENTION

An object of the present invention is to provide an enamel for glass panes having silver conducting tracks comprising a glass frit and of one or more pigments in the form of heavy-metal oxides or sulfides which exhibits an improved opacity to silver layers.

In achieving the above and other objects, one feature of the invention resides in an enamel containing, in addition to 60 to 89.9% by weight glass frit and 1 to 30% by weight pigments, an amount of 0.1 to 10% by weight total of at least one of silicon, boron, carbon, lead and/or silver in elemental form based on the weight of the enamel.

Mixtures of these additives have also proven themselves, especially silver and boron, silver and silicon, boron and silicon or silicon and lead.

Preferred components are:
0.1 –5% by weight silver
1 –10% by weight B or Si
1 –10% by weight C or Pb.

The enamel, consisting of finely-ground glass frits, finely-ground pigments and finely-ground additives, is finely comminuted and mixed in order to obtain a homogenous mass.

Then, a paste is prepared with a suitable medium which paste is applied by means of screen process printing onto flat glass whose thickness can be between approximately 2 and 8 mm. The viscosity of the enamel paste should be approximately 250 poises and the thickness of the applied layer 10 to 20 μm.

After the enamel has dried, a layer of silver 5 to 10 μm thick is impressed onto it using known silver pastes. A heat treatment then takes place which is carried out between 580 and 750° C. for 2 to 20 minutes, depending on the type and the thickness of the glass.

The firing or stoving atmosphere is conventional; i.e. in air.

In comparison to conventional glass-pane enamels, the enamels of the invention exhibit a stronger surface matting. In particular, however, the fluctuations in color between the silver-covered and the silver-free areas of the enamel layers are almost completely eliminated, that is, the opacity for silver is quite considerably improved by the enamel composition of the invention. The electric properties of the silver conducting tracks are not changed thereby, nor is their ability to be soldered adversely affected.

DETAILED EMBODIMENTS OF THE INVENTION

The following examples serve to further illustrate the invention.

Auto-pane coatings were produced with the following enamels and subsequently provided with silver conducting tracks:

EXAMPLE 1

The following table shows the composition (percent by weight) of a black enamel according to the invention as well as the composition of the glass frit for its manufacture.

|  | Enamel | Glass Frit |
| --- | --- | --- |
| PbO | 40.65 | 50.8 |
| SiO$_2$ | 26.7 | 33.4 |
| Cr$_2$O$_3$ | 12.35 |  |
| CuO | 6.65 |  |
| B$_2$O$_3$ | 3.2 | 4.0 |
| Na$_2$O | 2.95 | 3.7 |
| TiO$_2$ | 2. | 2.45 |
| ZrO$_2$ | 1.9 | 2.4 |
| Al$_2$O$_3$ | 1.1 | 1.4 |
| Ag | 1.0 |  |
| ZnO | 0.6 | 0.75 |
| CaO | 0.5 | 0.6 |
| K$_2$O | 0.4 | 0.5 |

80% by weight of a glass frit of the above composition and particle size 1 to 20 μm is mixed with 19% by weight of a black pigment (copper - chromium oxide), particle size 1 to 20 μm, and 1% by weight silver powder, particle size 1 to 10 μm, and finely comminuted. The enamel exhibits a linear coefficient of thermal expansion of $88 \times 10^{-7} °C^{-1}$ and a fusion [softening] point of 480° C. The stoving temperature should be between 630 and 680° C.

EXAMPLE 2

A black enamel is produced in analogy with Example 1. The composition (percent by weight) of the enamel and the glass frit for its manufacture are given below.

|  | Enamel | Glass Frit |
| --- | --- | --- |
| PbO | 43.8 | 54.7 |
| SiO$_2$ | 25.9 | 32.4 |
| Cr$_2$O$_3$ | 11.1 |  |
| CuO | 5.9 |  |
| B$_2$O$_3$ | 4.6 | 5.8 |
| Na$_2$O | 1.75 | 2.2 |
| TiO$_2$ | 1.35 | 1.7 |
| ZrO$_2$ | 1.15 | 1.4 |
| CaO | 0.95 | 1.2 |
| K$_2$O | 0.5 | 0.6 |
| Si | 3.0 |  |

The enamel consists of 80% by weight glass frit, 17% by weight black pigment and 3% by weight silicon powder. It exhibits a linear coefficient of thermal expansion of $83 \times 10^{-7} °C^{-1}$ and a fusion point of 510° C.

EXAMPLE 3

A grey enamel is produced in analogy with Example 1. The table shows the composition (percent by weight) of the grey enamel and the glass frit for its manufacture.

|  | Enamel | Glass Frit |
| --- | --- | --- |
| PbO | 47.2 | 54.6 |
| SiO$_2$ | 27.2 | 31.5 |
| Cr$_2$O$_3$ | 6.5 |  |
| TiO$_2$ | 3.8 | 3.2 |
| Na$_2$O | 3.7 | 4.3 |
| CuO | 3.5 |  |
| B$_2$O$_3$ | 2.9 | 3.3 |
| ZrO$_2$ | 2.7 | 3.1 |

-continued

|  | Enamel | Glass Frit |
| --- | --- | --- |
| Si | 2.5 |  |

The enamel consists of 86.5% (by weight) of the glass frit, 10% by weight black pigment, 1% weight titanium oxide and 2.5% by weight silicon powder. The linear coefficient of thermal expansion is $81 \times 10^{-7} °C^{-1}$ and the fusion point is at 520° C.

These enamels can be applied onto glass panes by means of screen process printing and stoved at 630 to 680° C. Silver imparts a black color tone with a tinge of brown to the enamel on clear glass; however, on green glass it favors the blue coloring of the enamel. Silicon supplies color tones on clear glass and on green glass which can extend from black to grayish black on clear glass.

A layer of silver 5 to 10 μm thick is applied in tracks onto this layer of enamel, likewise by means of screen process printing, with a commercially available silver paste (75 % silver, remainder resin and solvent) and stoved at 630 to 680° C.

The opacity of the layer of enamel relative to (opposite) the layer of silver was measured colorimetrically. The change of the colorimetric values of the enamel at the transition from silver-covered to silver-free areas was determined thereby. The additives of the invention in the enamel reduce the variations in color, which is confirmed by visual observation. The opacity for silver is better with these enamels.

Further variations and modifications will be apparent to those skilled in the art from the foregoing and are intended to be encompassed by the appended claims.

EPO priority application 89 100 078.8 is relied on and incorporated herein by reference.

We claim:

1. An enamel for glass panes provided with silver conducting tracks which consists of a glass frit and one or more pigments in the form of heavy metal oxides and heavy metal sulfides, which contains, in addition to 60 to 89.9% by weight glass frit and 1 to 30% by weight pigments, 0.1 to 10% by weight of one of boron, carbon, lead, silver, silver mixed with boron, boron mixed with silicon and silicon mixed with lead, in elemental form.

2. An enamel as claimed in claim 1, which upon being stoved exhibits improved opacity for silver tracks thereon without adversely affecting the electric properties or the solderability of the silver tracks.

3. An enamel for coating onto glass panes provided with silver conducting layers on enamelled zones which consists of a homogeneous, finely comminuted powder mixture of, by weight, 60 to 89.9% glass frit, 1 to 30% of one or more pigments in the form of heavy metal oxides and heavy metal sulfides and 0.1 to 10% of an additive in elemental form selected from boron, carbon, lead, silver, silver mixed with boron, boron mixed with silicon and silicon mixed with lead, whereby the stoved enamel exhibits improved opacity for silver layers over opacity exhibited by stoving the same enamel without the elemental additive.

4. An enamel as claimed in claim 3, which exhibits improved opacity without adversely affecting the electric properties or the solderability of the silver layers.

5. An enamel as claimed in claim 3, in which the glass frit has the following composition:

| | |
|---|---|
| PbO | 50.8 |
| SiO$_2$ | 33.4 |
| B$_2$O$_3$ | 4.0 |
| Na$_2$O | 3.7 |
| TiO$_2$ | 2.45 |
| ZrO$_2$ | 2.4 |
| Al$_2$O$_3$ | 1.4 |
| ZnO | 0.75 |
| CaO | 0.6 |
| K$_2$O | 0.5 | the pigment is a black pigment of copper-chromium oxide, the elemental additive is silver, and all powders are between 1 and 20 microns.

6. An autopane coated with enamel zones of thickness between 10 and 20 microns provided with silver conducting tracks of thickness between 5 and 10 microns in which the enamel has been applied as a paste by screen process printing, and the dried enamel is a homogeneous mixture of powders between 1 and 20 microns in size consisting of not more than 89.9% of a glass frit, 1 to 30% of one or more pigments selected from heavy metal oxides and heavy metal sulfides and 0.1 to 10% of an elemental additive selected from boron, carbon, lead, silver, and mixtures of silver with boron, boron with silicon and silicon with lead.

7. An autopane as claimed in claim 6, which has been stoved at between 630 and 680° C.

8. An autopane as claimed in claim 6 in which the color of the enamel is black.

9. A method of coating a flat glass with enamel zones provided with silver conducting tracks comprising the steps of selecting an enamel which is a homogeneous, finely comminuted powder mixture consisting of, by weight, not more than 89.9% of a glass frit, 1 to 30% of one or more pigments selected from heavy metal oxides and heavy metal sulfides and 0.1 to 10% of an elemental additive selected from boron, carbon, silver, lead and mixtures of silver with boron, boron with silicon and silicon with lead, preferably a screen-printable paste of the enamel with a suitable medium, applying the paste by screen process printing onto a flat glass of thickness between approximately 2 and 8 mm, after the enamel has dried, impressing onto the dried enamel zone by screen process printing tracks of silver paste, and carrying out a heat treatment of the twice coated glass between 580 and 750° C. for 2 to 20 minutes.

10. A method as claimed in claim 9, in which the viscosity of the enamel paste is about 250 poises, the enamel zone layer has a thickness between 10 and 20 microns, the tracks of silver paste have a thickness between 5 and 10 microns, and the heat treatment is carried out between 630 and 680° C.

* * * * *